United States Patent
Schuntermann (12)

(10) Patent No.: US 6,400,134 B1
(45) Date of Patent: Jun. 4, 2002

(54) AUTOMATED BAD SOCKET MASKING IN REAL-TIME FOR TEST HANDLERS

(75) Inventor: Joerg Stefan Schuntermann, Glen Allen, VA (US)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/619,075

(22) Filed: Jul. 17, 2000

(51) Int. Cl.[7] .............................................. G01R 31/02
(52) U.S. Cl. ..................................... 324/158.1; 324/538
(58) Field of Search ............................. 324/765, 158.1, 324/517, 538, 755; 702/181, 182; 714/3

(56) References Cited

U.S. PATENT DOCUMENTS

| | | | | |
|---|---|---|---|---|
| 4,342,958 A | * | 8/1982 | Russell | 324/537 |
| 4,868,493 A | | 9/1989 | Becker | 324/537 |
| 5,283,605 A | * | 2/1994 | Land-Dahlke | 324/538 |
| 5,960,185 A | * | 9/1999 | Nguyen | 716/9 |
| 6,064,195 A | * | 5/2000 | Clayton et al. | 324/158.1 |

* cited by examiner

Primary Examiner—Ernest Karlsen

(57) ABSTRACT

A method for testing semiconductor chips, in accordance with the present invention, includes connecting semiconductor chips to a plurality of sockets for testing the semiconductor chips. The sockets are contacted to perform testing on the semiconductor chips. The performance of the sockets are checked after a predetermined number of contacting steps by calculating a level of confidence for each socket. Sockets with the level of confidence exceeding a threshold level are masked to prevent further testing with those sockets.

18 Claims, 3 Drawing Sheets

AUTOMATED BAD SOCKET MASKING IN REAL-TIME FOR TEST HANDLERS

BACKGROUND

1. Technical Field

This disclosure relates to semiconductor testing, and more particularly, to a method for increasing test throughput by providing a method for determining bad handler sockets to avoid retest caused by bad socket performance.

2. Description of the Related Art

Fabricated semiconductor chips are tested to ensure quality and performance. Chip test systems include handlers and test heads, which provide a plurality of test sockets. Each test socket, in turn, includes a plurality of test pins. Many chips are tested in parallel, and each socket is employed to test one chip at a time. During testing operations, bad sockets go undetected, and are responsible for the rejection of otherwise good chips. At the end of a testing sequence or at a regular interval, sockets are recalibrated or tested to determine their status. Only then are the bad sockets determined. At this point all chips tested by these sockets must be retested. This results in reduced throughput and wasted time due to retesting.

Therefore, a need exists for a bad socket masking method, which identifies bad sockets during testing operations, and removes the bad sockets to prevent the bad sockets from continuing to test chips.

SUMMARY OF THE INVENTION

A method for testing semiconductor chips, in accordance with the present invention, includes connecting semiconductor chips to a plurality of sockets for testing the semiconductor chips. The sockets are contacted to perform testing on the semiconductor chips. The performance of the sockets are checked after a predetermined number of contacting steps by calculating a level of confidence for each socket. Sockets with the level of confidence exceeding a threshold level are masked during testing to prevent further testing with those sockets.

Another method for testing semiconductor chips in a lot, in accordance with the present invention, includes loading a portion of the lot of semiconductor chips into sockets of a handler of a tester for testing the semiconductor chips and contacting the sockets to perform testing on the semiconductor chips. The steps of loading and contacting are performed a predetermined number of times. The performance of the sockets are checked after the predetermined number of contacting steps by calculating a level of confidence for each socket. Sockets with the level of confidence exceeding a threshold level are masked to prevent further testing with those sockets for the rest of the lot of the semiconductor chips. The above steps are repeated until all of the semiconductor chips of the lot are tested.

In other methods, calculating a level of confidence for each socket may include calculating a level of confidence based on a cumulative probability function, and the cumulative probability function may include a binomial distribution. The step of contacting the sockets may include the step of performing a probe touchdown on the sockets to test the chips loaded in the sockets. The step of repeating the steps of contacting, checking and masking until all of the semiconductor chips in a lot are tested is preferably included. The sockets that have a level of confidence exceeding a threshold level are considered bad sockets, and the step of retesting only the chips tested by bad sockets which were determined to be bad sockets between a last step of checking the sockets and a current step of checking the sockets is preferably included. The step of masking may include the step of disabling the sockets with the level of confidence exceeding the threshold level by electrically disconnecting the sockets during testing or by reprogramming an operating system of the tester.

These and other objects, features and advantages of the present invention will become apparent from the following detailed description of illustrative embodiments thereof, which is to be read in connection with the accompanying drawings.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present invention includes semiconductor testing methods. In particular, the present invention is directed to calculating socket over-rejection in real-time during testing of a semiconductor chip lot. The over-rejection calculation is employed to determine any bad handler sockets, which are being employed for testing the semiconductor chips. These bad sockets may include sockets, which are broken, dirty, performing below required specifications or any other criteria. The bad sockets are masked or otherwise disabled so that they are no longer used for testing the rest of the lot, either during the remaining main measurement or before any retesting. Masking bad sockets during the main measurement significantly reduces the need for retest. Masking the bad sockets before retest also significantly improves the recovery rate of chips which would have been previously considered failing.

Figure 1:
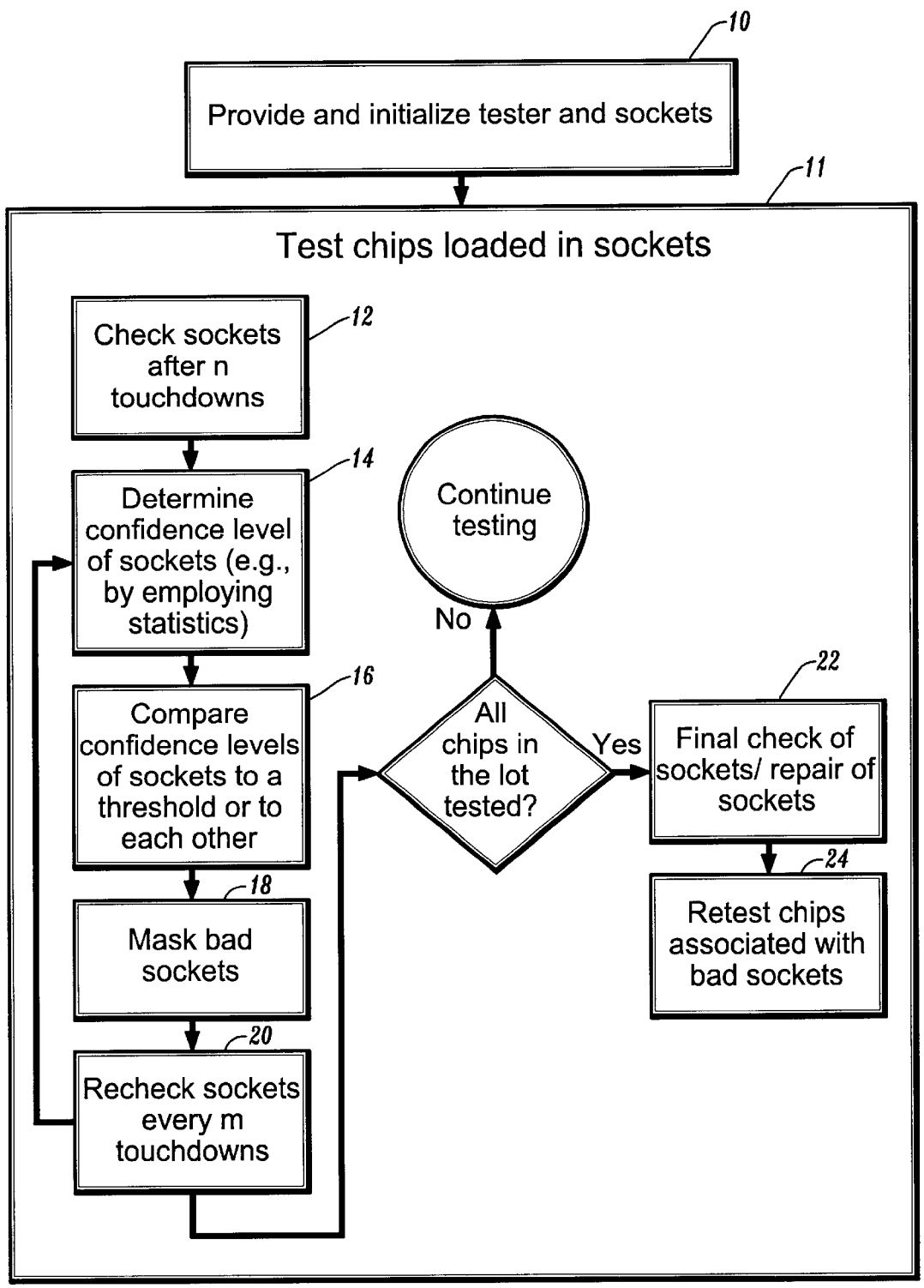
FIG. 1 is a block/flow diagram showing a system/method for reducing socket over-rejection is semiconductor testing systems in accordance with the present invention.

Referring now in specific detail to the drawings in which like reference numerals identify similar or identical elements throughout the several views, and initially to FIG. 1, a block/flow diagram for a system/method for checking and disabling bad sockets of semiconductor testers is shown in accordance with the present invention. In block 10, a tester is initialized with a plurality of sockets, which have been calibrated. In one embodiment, a semiconductor tester includes a plurality of handlers, for example, 2 handlers, although single handler systems may also be employed. Handlers are employed as is known in the art to provide sockets for chips to be tested and to cause pins of each socket to contact pins (e.g., input/output pins) on a chip. When contact is made, a plurality of tests are performed on the chip to determine its quality and performance characteristics.

In block 10, all sockets are enabled on all handlers (or heads). Testing is performed, in block 11, for each touchdown of the sockets. The sockets are preferably employed in parallel, that is, the sockets are employed to test a plurality of chips simultaneously. In block 12, after a predetermined number of touchdowns, n, the performance of each socket is checked. This may be performed by a scoring method or by a tally for each socket. For example, socket 1 may have determined 3 failing chips in the last 5 touch downs, socket 2 may have determined zero failures in 5 touchdowns, etc. These values may be compared to historical data for socket performance or compared between the sockets themselves to determine if over-rejection is occurring. Statistical calculations are preferably performed based on the historical data and the current data for each socket. This information will be employed in the next step.

In block 14, based on the performance check a confidence level that a socket is bad is determined. This may include a statistical analysis based on present failures determined by the sockets and/or historical data, to determine socket quality. In a preferred embodiment, a linear or binomial function is employed to determine socket quality. The statistical analysis preferably supplies an output value for each socket. The output value is employed to determine the state of the socket. The output value may include a confidence value indicating a level of confidence that a particular socket is bad. In block 16, the output values for all sockets are compared to a threshold value to determine if the sockets are bad. Alternately, confidence levels of the sockets may be compared against the confidence levels of other sockets.

If the sockets or pins of the sockets are bad, for example, broken, dirty, performing below required specifications, etc. The sockets are masked in block 18. Masking may include covering bad sockets or electrically disconnecting bad sockets. In one embodiment, software controlled socket masking is performed to disable bad sockets. This is realized by reprogramming the handler or tester operating system. This may be provided by changing the point in time when a socket mask becomes effective for testing. For example, the socket may be given a time to be effective after lot testing is complete. The operating system is employed to disable bad sockets in real-time during testing operations.

Tester systems, for example, testers available commercially from Advantest America, Inc. of Santa Clara, Calif., such as model numbers, T5365P, T5581H, and/or T5592, may be employed for testing semiconductor chips. These systems may supply chips based on a number of sockets available for testing. Therefore, if sockets are disabled or masked, the tester system will be adapted to provide a number of chips for testing corresponding to a number of good sockets. This avoids testing chips with bad sockets.

In block 20, the sockets are rechecked after every m touchdowns where m may or may not be equal to n. This is continued throughout the testing of a given lot of chips. In block 22, upon completion of all touchdowns, all sockets are checked again and bad sockets are repaired or replaced. Since real-time checking and masking of bad sockets is performed during testing, fails of tested chips are actual fails and no retesting of these failed chips needs to be performed on chips tested by good sockets.

In block 24, chips tested by bad sockets are retested by good sockets. Advantageously, only the chips tested by bad sockets, which were determined to be bad sockets during a last checking step, need to be retested. For example, a first check is performed and no sockets are bad. After m touchdowns, another check is performed with only one socket being determined as bad. Only the chips tested by the bad socket in the last m touchdowns need to be retested.

Referring to FIGS. 2–5, an example of one implementation of the present invention will now be illustratively described. In the example, a two-handler system is employed including handlers A and B. Each handler includes 128 sockets 12. Handlers include test boards, which have a number of sockets therein for testing chips. Test boards may include, for example, 4 to 128 sockets each. It is to be understood that the number of handlers and/or sockets may be changed to accommodate different testing scenarios, testing volume and test equipment. Sockets 12 each include a plurality of pins (not shown), for example, 66 pins per socket. The number of pins per sockets is dependent on the types and size of the chips to be tested. In the example, assume a lot size of about 12,000 chips to be tested. With the dual handler system, 128 chips can be tested in parallel per head (handler). This means that approximately 46 touchdowns are needed to be performed to test the entire lot. In this case, socket performance will be tested every 5 touchdowns (e.g., n=m=5). In other embodiments, n and m should be selected to minimize the number of failings due to socket over-rejection.

Figure 2:
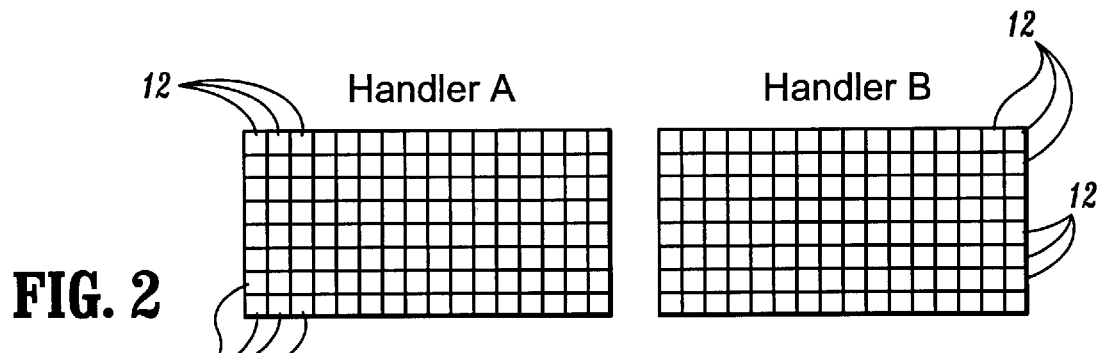
FIGS. 2–5 are schematic diagrams showing bad sockets identified and masked during different stages of testing in accordance with the present invention.
Figure 3:
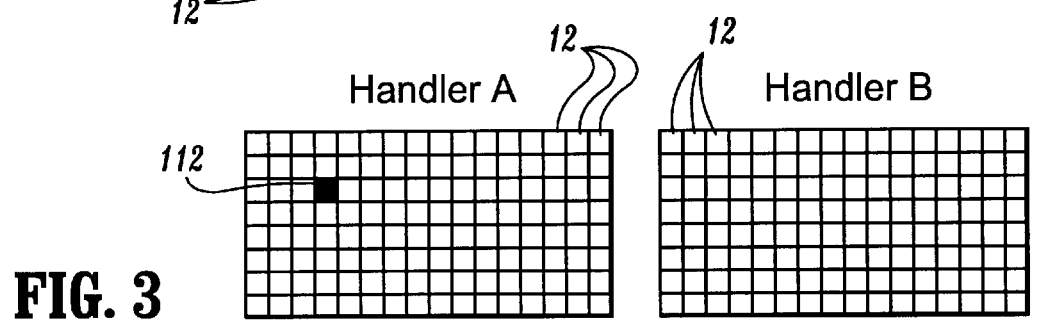
Figure 4:
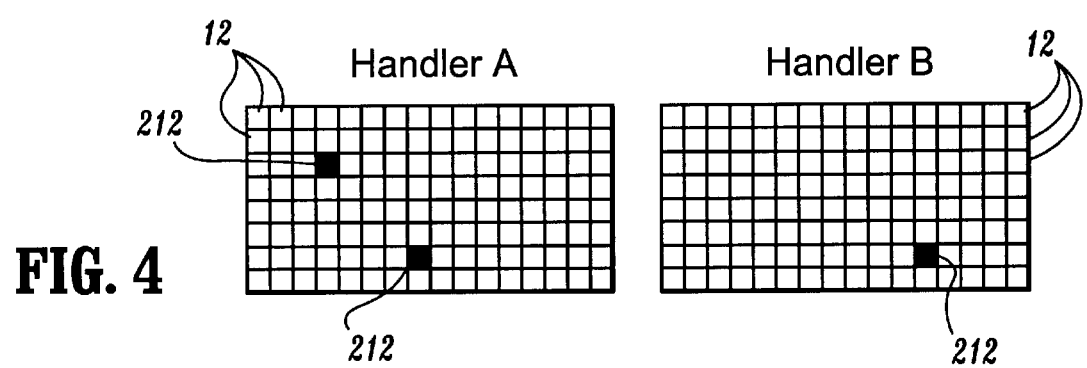
Figure 5:
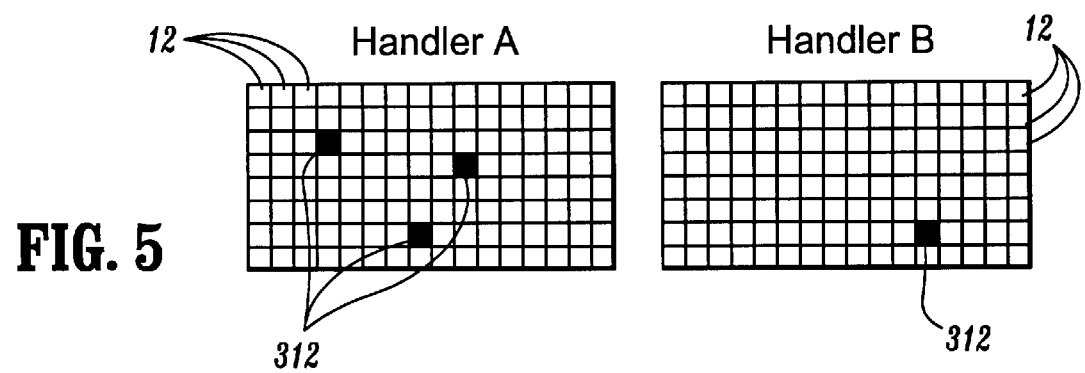

In FIG. 2, all test sockets 12 are enabled on both handler A and B. The performance of the sockets is checked, for example, every 5 touchdowns. A calculation is performed based on the number of failures each socket has experienced, and socket 112 of FIG. 3 has been determined to be bad (e.g., a low confidence score was calculated) after, for example, 15 touchdowns. Socket 112 is electrically disabled either by a physical disconnection or through software masking via an operating system of the tester. Socket 112 will no longer be employed for testing within this lot of chips. After 25 touchdowns, sockets 212, as shown in FIG. 4, are also determined to be bad and are masked or disabled. Finally, socket 312 (FIG. 5) is determined to be bad at the completion of the testing.

In the 46 touchdowns, the most chips that need to be retested are 5 chips preceding the failures (e.g., n=m=5) of each of the sockets, which were determined as bad. This corresponds to 5 chips times 4 sockets (masked) or 20 chips. This number can be reduced with smaller n and m values. For example if n=m=1, only 4 chips need to be retested due to socket over-rejection. In the prior art method, all 46 chips for all failing sockets must be retested or 46 chips times 4 sockets or 184 chips!

Over-rejection Calculation

A binomial function may be employed to calculate socket over-rejection on the data of just one lot or a partial lot. The calculation is done in a statistical way and an output value provides a confidence factor (how sure can you be that a socket is really bad). A binomial distribution permits the determination of a probability P of exactly r successes in N tries of an event with two mutually exclusive outcomes (e.g., flipping a coin, the outcome could be a head or a tail). A binomial distribution may be given by the formula:

$$P(r) = \frac{N!}{r!(N-r)!} \cdot p^r \cdot (1-p)^{N-r}$$

where p is the probability of a single fail.

The cumulative form of the binomial function can be employed to calculate the over-rejection of each socket compared to all available sockets. For example, a total number of chips tested so far is equal to 7266 with 6093 passing and 1173 failing). This include historical test data for a given lot or lots, or testing over time. The probability of a single fail is P=fails/total=1173/7266 =0.1614.

For a given socket arrangement, a socket was used 156 times (N=156) resulting in 45 failed chips. The binomial cumulative probability is $$P(r) = \sum_{i=45}^{156} P(r_i) \text{ with } P(r=45) =$$

$$\frac{156!}{45!(156-45)!} \cdot (0.1614)^{45} \cdot (1-0.1614)^{156-45}$$

If the binomial cumulative probability of a socket is less than 0.001 (0.1%), it can be concluded with a 100%–0.1%= 99.9% confidence level that this socket is causing over-rejection. A confidence level of about 95% or higher is preferred, although other confidence levels may be employed. For example, if a higher confidence than 95% exists that a socket is bad, the socket is masked. Other distributions and probability determinations may also be employed to determine socket over-rejection.

Figure 6:
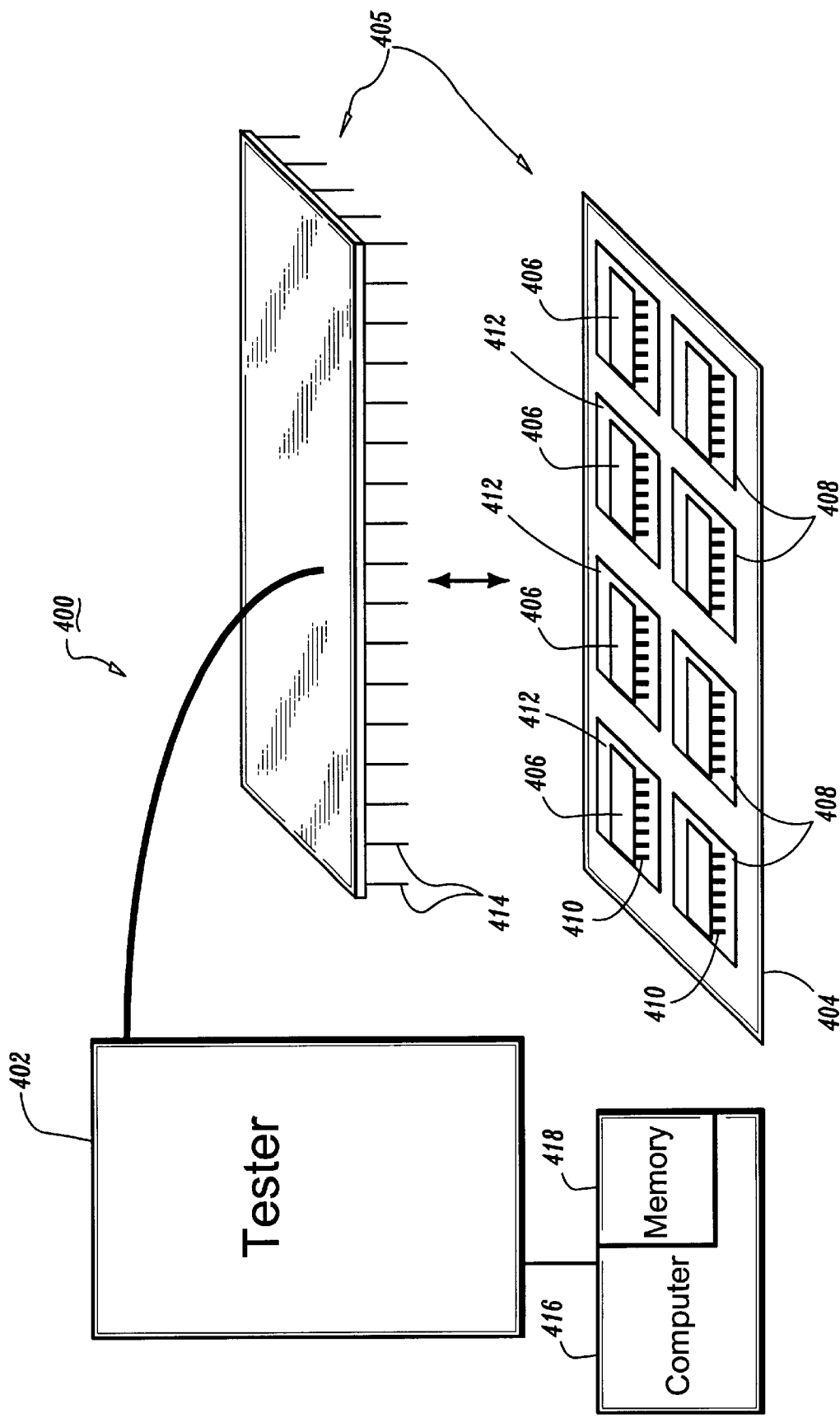
FIG. 6 is a block diagram schematically showing a test system for the present invention.

Referring to FIG. 6, a system 400 for testing semiconductor chips is shown which may be employed in accordance with the present invention. System 400 includes a tester 402, for example, an Advantest system, such as, testers T5365P, T5581H, T5592, etc., available commercially from Advantest America, Inc. Tester 402 includes hardware and software for generating data test patterns, performing tests and acquiring and comparing data, etc. for testing semiconductor chips as is known in the art. Tester 402 includes an operating system for controlling the testing tasks which system 400 performs. Test boards 404 for a handler 405 are employed for loading chips 406 therein. Handler 405 may include an Advantest handler, such as, handlers M6741A, M6761A, M6761AD, etc., available commercially from Advantest, Inc. Chips 406 are loaded into sockets 408. Sockets 408 provide pins 410, which make a mechanical connection to the pins of each chip. These mechanical connections degrade over time and are the cause of socket over-rejection. Test board 404 includes pads or touchdown points 412 which make contact to probes or pins 414 of handler 405.

A computer processor 416 is provided to interact with test boards or tester to determine the state of the sockets in accordance with the present invention. Computer 416 includes memory 418 for storing programs to calculate probabilities that sockets have gone bad. For a binomial distribution, information about the number of touchdowns (e.g., contact between the tester probe and socket pins) each socket has undergone, chip or test failures, total number of failures or measurements on sockets themselves is taken and collected in memory 418. This information is accessed and employed to perform real time socket over-rejection calculations. When a socket 408 is determined to be bad, it is physically masked (e.g., a dummy chip is placed in the bad socket) or disabled (e.g., by a switch) or virtually disabled by modifying the operating system of tester 402. Testing continues with intermittent additional socket checks.

Having described preferred embodiments for automated bad socket masking in real-time for test handlers (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for testing semiconductor chips, comprising the steps of:
   connecting semiconductor chips to a plurality of sockets for testing the semiconductor chips;
   contacting the sockets to perform testing on the semiconductor chips;
   checking the performance of the sockets after a predetermined number of contacting steps by calculating a level of confidence for each socket; and
   masking sockets with the level of confidence exceeding a threshold level, during testing, to prevent further testing with the sockets, which are masked.

2. The method as recited in claim 1, wherein calculating a level of confidence for each socket includes calculating a level of confidence based on a cumulative probability function.

3. The method as recited in claim 2, wherein the cumulative probability function includes a binomial distribution.

4. The method as recited in claim 1, wherein the step of contacting the sockets includes the step of performing a probe touchdown on the sockets to test the chips loaded in the sockets.

5. The method as recited in claim 1, further comprising the step of repeating the steps of contacting, checking and masking until all of the semiconductor chips in a lot are tested.

6. The method as recited in claim 5, wherein the sockets having a level of confidence exceeding a threshold level are considered bad sockets, and further comprising the step of retesting only the chips tested by bad sockets which were determined to be bad sockets between a last step of checking the sockets and a current step of checking the sockets.

7. A method for testing semiconductor chips in a lot, comprising the steps of:
   loading a portion of the lot of semiconductor chips into sockets of a handler of a tester for testing the semiconductor chips;
   contacting the sockets to perform testing on the semiconductor chips;
   repeating the steps of loading and contacting a predetermined number of times;
   checking the performance of the sockets after the predetermined number of contacting steps by calculating a level of confidence for each socket;
   masking sockets with the level of confidence exceeding a threshold level to prevent further testing with the sockets which are masked for the lot of the semiconductor chips; and
   repeating the above steps until all of the semiconductor chips of the lot are tested.

8. The method as recited in claim 7, wherein calculating a level of confidence for each socket includes calculating a level of confidence based on a cumulative probability function.

9. The method as recited in claim 8, wherein the cumulative probability function includes a binomial distribution.

10. The method as recited in claim 7, wherein the step of contacting the sockets includes the step of performing a probe touchdown on the sockets to test the chips loaded in the sockets.

11. The method as recited in claim 7, wherein the sockets having a level of confidence exceeding a threshold level are considered bad sockets, and further comprising the step of retesting only the chips tested by bad sockets which were determined to be bad sockets between a last step of checking the sockets and a current step of checking the sockets.

12. The method as recited in claim 7, wherein the step of masking includes the step of disabling the sockets with the level of confidence exceeding the threshold level by electrically disconnecting the sockets during testing.

13. The method as recited in claim 7, wherein the step of masking includes the step of disabling the sockets with the level of confidence exceeding the threshold level by reprogramming an operating system of the tester.

14. A method for testing semiconductor chips in a lot, comprising the steps of:

provic a tester including at least one handler, the tester including probes;

loading a portion of the lot of semiconductor chips into sockets of the handler for testing the semiconductor chips;

contacting the sockets with the probes of the tester to perform testing on the semiconductor chips;

repeating the steps of loading and contacting a predetermined number of times;

checking the performance of the sockets after the predetermined number of contacting steps by calculating a level of confidence for each socket based on a cumulative probability function;

masking sockets with the level of confidence exceeding a threshold level to prevent further testing with the sockets which are masked for the lot of the semiconductor chips; and repeating the above steps until all of the semiconductor chips of the lot are tested.

15. The method as recited in claim 14, wherein the cumulative probability function includes a binomial distribution.

16. The method as recited in claim 14, wherein the sockets having a level of confidence exceeding a threshold level are considered bad sockets, and further comprising the step of retesting only the chips tested by bad sockets which were determined to be bad sockets between a last step of checking the sockets and a current step of checking the sockets.

17. The method as recited in claim 14, wherein the step of masking includes the step of disabling the sockets with the level of confidence exceeding the threshold level by electrically disconnecting the sockets during testing.

18. The method as recited in claim 14, wherein the step of masking includes the step of disabling the sockets with the level of confidence exceeding the threshold level by reprogramming an operating system of the tester.

* * * * *

UNITED STATES PATENT AND TRADEMARK OFFICE
CERTIFICATE OF CORRECTION

PATENT NO.   : 6,400,134 B1
DATED        : June 4, 2002
INVENTOR(S)  : Joerg Stefan Schuntermann It is certified that error appears in the above-identified patent and that said Letters Patent is hereby corrected as shown below:

<u>Title page,</u>
Item [73], should read as follows:

-- Infineon Technologies Richmond, LP Sandston, VA. --

Signed and Sealed this

First Day of July, 2003

JAMES E. ROGAN
*Director of the United States Patent and Trademark Office*